(12) United States Patent
Mann et al.

(10) Patent No.: US 6,532,169 B1
(45) Date of Patent: Mar. 11, 2003

(54) SONOS LATCH AND APPLICATION

(75) Inventors: Eric N. Mann, Sammamish, WA (US); John Kizziar, Spokane, WA (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 09/892,164

(22) Filed: Jun. 26, 2001

(51) Int. Cl.[7] .............................................. G11C 16/00
(52) U.S. Cl. ............... 365/185.08; 365/154; 365/189.05
(58) Field of Search ....................... 365/185.04, 185.08, 365/189.05, 154

(56) References Cited

U.S. PATENT DOCUMENTS

| | | | | |
|---|---|---|---|---|
| 4,931,997 A | * | 6/1990 | Mitsuishi et al. ...... | 365/185.04 |
| 5,638,323 A | * | 6/1997 | Itano ..................... | 365/185.22 |
| 5,768,208 A | * | 6/1998 | Bruwer et al. ......... | 365/185.08 |
| 5,774,400 A | | 6/1998 | Lancaster et al. ........ | 365/185.3 |
| 5,864,499 A | * | 1/1999 | Roohparvar et al. ... | 365/185.08 |
| 5,892,712 A | | 4/1999 | Hirose et al. ........... | 365/185.07 |
| 6,026,018 A | | 2/2000 | Herdt et al. ............ | 365/185.07 |
| 6,122,191 A | | 9/2000 | Hirose et al. ........... | 365/185.01 |
| 6,172,907 B1 | | 1/2001 | Jenne ..................... | 365/185.18 |

* cited by examiner

Primary Examiner—Tan T. Nguyen
(74) Attorney, Agent, or Firm—Christopher P. Maiorana, P.C.

(57) ABSTRACT

An apparatus comprising a latch circuit, a non-volatile storage circuit, and a switching circuit. The latch circuit may be configured to be dynamically programmable. The non-volatile storage circuit may be configured to be re-programmable. The switching circuit may be configured to transfer data from (i) the non-volatile memory element into the latch circuit in response to a first control signal and (ii) the latch circuit into the non-volatile memory circuit in response to a second control signal.

20 Claims, 4 Drawing Sheets

SONOS LATCH AND APPLICATION

FIELD OF THE INVENTION

The present invention relates to a method and/or architecture for latches generally and, more particularly, to a method and/or architecture for a silicon, oxide, nitride, oxide, silicon (SONOS) technology latch.

BACKGROUND OF THE INVENTION

Conventional static random access memories (SRAMs) can include a combination of volatile circuits such as latch circuits coupled to nonvolatile (NV) circuits such as EPROM and EEPROM. Data can be programmed into the NV circuits and loaded into the latch circuits at startup.

Conventional latch and NV storage designs have the following disadvantages: (i) data can be transferred from the non-volatile memory to the latches only at startup, (ii) lack of non-volatile memory re-programmability (i.e., some conventional NV storage is only one-time programmable unless a UV window is provided), (iii) a separate sequencer (i.e., in PLD applications) and/or latches are required to transfer data from the NV storage to the latch or a RAM array, and/or (iv) lack of capability to read from or write to the latches dynamically (i.e., latches are not dynamically programmable).

It would be desirable to have a method and/or architecture for a latch that may (i) read from or write to the latch from a data bus, (ii) transfer data from non-volatile (NV) storage to the latch (e.g., initialize the latch with NV data), and/or program the NV storage with latch data.

SUMMARY OF THE INVENTION

The present invention concerns an apparatus comprising a latch circuit, a non-volatile storage circuit, and a switching circuit. The latch circuit may be configured to be dynamically programmable. The non-volatile storage circuit may be configured to be re-programmable. The switching circuit may be configured to transfer data from (i) the non-volatile memory element into the latch circuit in response to a first control signal, and (ii) the latch circuit into the non-volatile memory circuit in response to a second control signal.

The objects, features and advantages of the present invention include providing a method and/or architecture for a silicon, oxide, nitride, oxide, silicon (SONOS) latch that may (i) read from or write to a data bus, (ii) receive data from a non-volatile (NV) storage element, (iii) be initialized with data stored in the NV storage element, (iv) re-program the NV storage element with latch data, (v) dynamically program the NV storage element, and/or (vi) be implemented as a three-section (e.g., a read/write latch, a switching circuit, and a non-volatile storage element) non-volatile SRAM cell.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
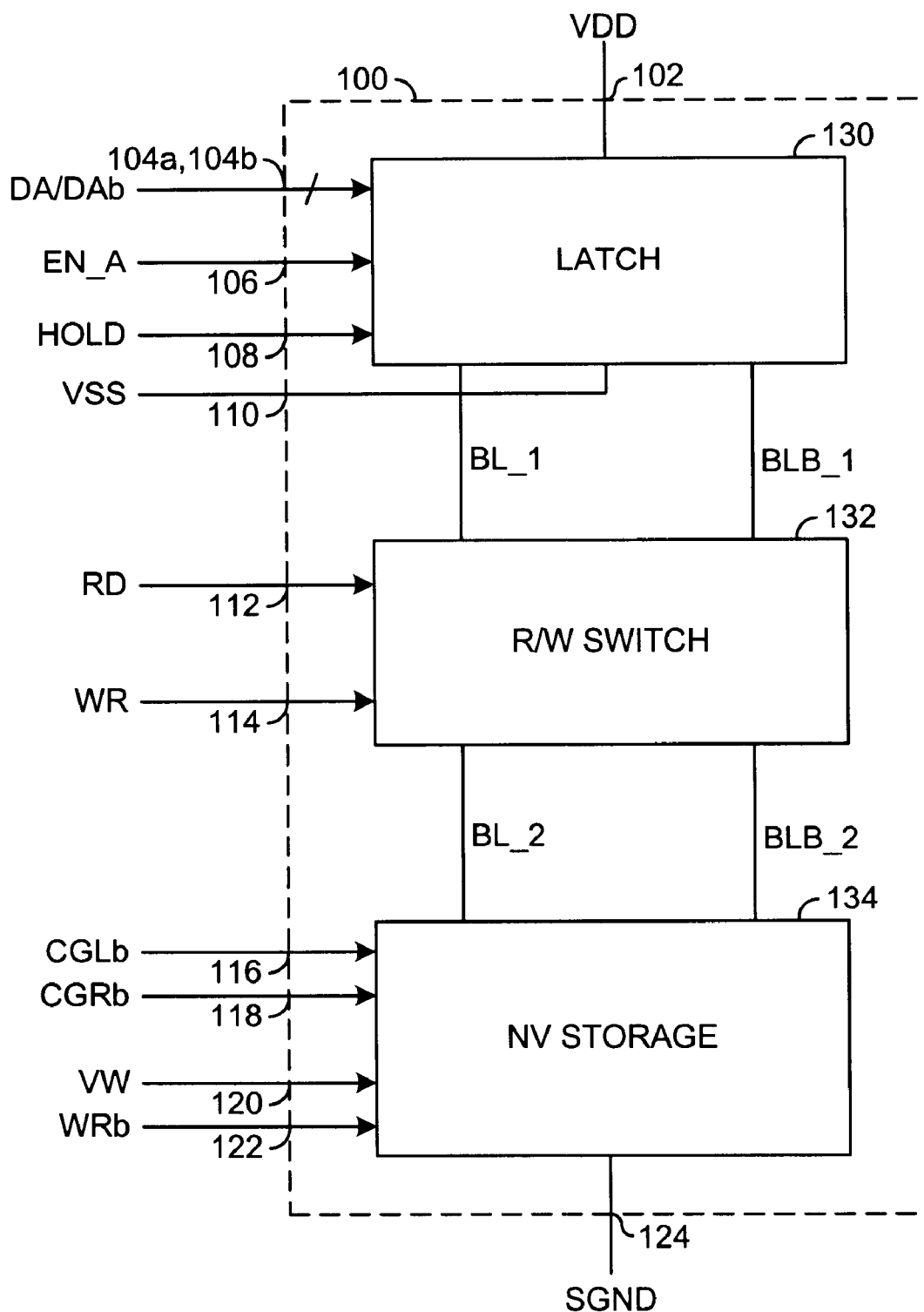
FIG. 1 is a block diagram of a preferred embodiment of the present invention.

Referring to FIG. 1, a block diagram of a circuit 100 is shown in accordance with a preferred embodiment of the present invention. The circuit 100 may be implemented, in one example, as a silicon, oxide, nitride, oxide, silicon (SONOS) three-section non-volatile (NV) SRAM cell. The circuit 100 may have an input 102 that may receive a power supply voltage (e.g., VDD), an input/output pair 104a and 104b that may receive/present a signal pair (e.g., DA and DAB, respectively), an input 106 that may receive a signal (e.g., EN_A), an input 108 that may receive a signal (e.g., HOLD), an input 110 that may receive a power supply ground (e.g., VSS), an input 112 that may receive a signal (e.g., RD), an input 114 that may receive a signal (e.g., WR), an input 116 that may receive a signal (e.g., CGLB), an input 118 that may receive a signal (e.g., CGRB), an input 120 that may receive a signal (e.g., VW), an input 122 that may receive a signal (e.g., WRB), and an input 124 that may receive a signal (e.g., SGND).

The signals DA and DAB may be data input/output signals that may be received/presented to the circuit 100 via one or more data busses (not shown). The signal DAB may be a digital complement of the signal DA. The signal EN_A may be a control signal that may control the writing and reading of the signals DA/DAB to and from the circuit 100. The signal HOLD may be a control signal that may hold (latch) data in the circuit 100. The signals RD, WR and WRB may be control signals that may control the transfer of data within the circuit 100. The signals CGLB, CGRB, VW, and SGND may be control signals that may control a programming operation of the circuit 100. The signal VW may control an erasing operation of the circuit 100. The signal WRB may be a digital complement of the signal WR. Further description of the signals LOAD, HOLD, RD, WR, CGLB, CGRB, WRB, SGND and VW may be found below in connection with TABLE 1.

In one example, the signals WR, CGLB, CGRB, SGND, and VW may have an erase/program voltage level (e.g., VPP) that is generally higher than a digital HIGH (e.g., H, "on", or 1) for the circuit 100. The voltage VPP may be a higher voltage level than the supply voltage VDD. Similarly, the power supply ground VSS may have a voltage level that is a digital LOW (e.g., L, "off", or 0). However, other relative voltage levels for the digital HIGH, the digital LOW, the voltage VPP, the supply voltage VDD, and the supply ground VSS may be implemented accordingly to meet the design criteria of a particular application.

In one example, the circuit 100 may comprise a circuit 130, a circuit 132, and a circuit 134. The circuit 130 may be implemented as a latch circuit. In one example, the circuit 132 may be implemented as a read/write switching circuit. The circuit 134 may be implemented as an NV storage circuit. The circuit 130 is generally coupled to the circuit 132 via a bitline/bitline bar pair (e.g., BL_1/ BLB_1). The circuit 132 is generally coupled to the circuit 134 via a bitline/bitline bar pair (e.g., BL_2/ BLB_2).

The circuit 132 is generally configured to enable data transfer between the circuits 130 and 134 in response to the signals WR, WRB and RD. In one example, the circuit 100 may be implemented using SONOS transistor technology. However, other transistor technologies may be implemented accordingly to meet the design criteria of a particular application.

The circuit 130 may be loaded with either (i) pre-programmed data from the circuit 134 or (ii) user-supplied data via the signals DA/DAB. The contents of the circuit 130 may be read by the user via the signals DA/DAB or written to the circuit 134 via the circuit 132.

In one example, the circuit 100 may be implemented with six (6) modes of operation. Example operations of the circuit 100 and corresponding logic states of various control signals may be summarized in the following TABLE 1:

TABLE 1

| Mode of Operation | LOAD | HOLD | RD | WR | CGLB & CGRB | WRB[3] | SGND | VW |
|---|---|---|---|---|---|---|---|---|
| 1. Idle (Hold) | L | H | L | L | L | H | L | L |
| 2. Bus Write to Latch | H | H[1] | L | L | L | H | L | L |
| 3. Bus Read from Latch | H | H | L | L | L | H | L | L |
| 4. NV Latch Load | L | L->H | H | L | L | H | L | L |
| 5. Erase SONOS (Bulk) | L | H | L | L | L | X[2] | VPP | VPP |
| 6. Program SONOS (from latch) | L | H | L | VPP | VPP | L | L | L |

[1]The signal HOLD is generally HIGH during the bus write to latch operation. However, placing the signal HOLD in a LOW state during the bus write to latch operation may reduce or eliminate contention between the data busses in some implementations of the circuit 100.
[2]X may be any value between 0V and VPP.
[3]When the circuit 100 is operated in any of the modes one through four, the value of the signal WRB is generally a logic HIGH. However, the value of the signal WRB may be any value above an NFET threshold (e.g., $V_{TN}$).

When the circuit 100 is operating a first mode (e.g., an idle or hold mode), data may be latched in the circuit 130. When the circuit 100 is operating in a second mode (e.g., a bus write to latch mode), data may be written to the circuit 130 via the data bus signals DA/DAB. When the circuit 100 is operating in the bus write to latch mode, the circuit 132 may be configured to decouple the circuit 134 from the circuit 130. The circuit 100 may have a third mode that may be a read mode (e.g., a bus read from latch mode). When the circuit 100 is in the bus read from latch mode, data stored in the circuit 130 may be presented as the signals DA/DAB. The modes 1–3 of circuit 100 may operate similarly to a conventional volatile latch circuit.

When the circuit 100 is operating in a fourth mode (e.g., an NV latch mode), data may be loaded (e.g., written) into the circuit 130 from the circuit 134 via the circuit 132. In one example, the circuit 100 may be configured to transfer data from the circuit 134 to the circuit 130 on system startup. When the circuit 100 is operated in the fourth mode, the signals LOAD, HOLD, RD, WR, CGLB, CGRB, WRB, SGND, and VW may have the states shown in TABLE 1.

When the circuit 100 is operating in a fifth mode (e.g., a bulk erase mode), the circuit 134 may be configured to enter an erased state. The circuit 134 is generally erased prior to being programmed and/or re-programmed. However, in some implementations the circuit 134 may be programmed and/or re-programmed without being erased prior to programming/re-programming. When the circuit 100 is operating in a sixth mode (e.g., a programming mode), data latched in the circuit 130 may be loaded (written) to the circuit 134 via the circuit 132. The circuit 100 may comprise additional circuitry (e.g., charge pump circuitry, biasing circuitry, etc. not shown) to aid erasing of the circuit 134 (e.g., mode 5) and/or the programming/re-programming of the circuit 134 (e.g., mode 6).

When the circuit 100 is powered up, the data stored in the circuit 134 may be loaded into the circuit 130. The circuit 100 generally initializes in a known configuration (e.g., the circuit 100 may initialize to default data that has been programmed in the circuit 134). The circuit 134 may be re-programmable. The circuit 134 may be dynamically field programmable to new start-run configurations (e.g., new default configurations). The circuit 130 may be dynamically programmable. However, the circuit 100 will generally restart at a known default configuration (e.g., the configuration determined by data programmed into the circuit 134).

When the circuit 100 is switched on, the data stored in the circuit 134 may be loaded into the circuit 130 and the circuit 100 may be initialized in a predetermined state. The circuit 130 configuration may be dynamically changed. The signals DA/DAB may be used to program different data into the circuit 130 (e.g., mode 2).

When the circuit 100 is switched off, the newly programmed data is generally lost. The next time the circuit 100 is switched on, the default data (e.g., the data previously stored in the circuit 134) is generally loaded into the circuit 130. However, the user may load data from the circuit 130 into the circuit 134 so that on subsequent startup the circuit 100 is switched on with a new default condition. The number of times the circuit 134 may be re-programmed (e.g., the number of times a new default condition may be programmed into the circuit 100) is generally unlimited.

In one example, the circuit 100 may be used to store configuration information for frequency tables, look-up tables, selecting configurations, selection of chip pins, familiarization of A/D converters, function enabling, etc. The circuit 100 may be implemented for a variety of chip applications (e.g., oscillators, clock chips, counters, dividers, multiplexers, etc.). In another example, the circuit 100 may be used to (i) store spread spectrum modulation parameter values for a range of chip frequencies, (ii) configure a particular set of frequencies presented at particular chip pins, (iii) set remote capacitance values for crystal oscillator control, (iv) organize voltage to capacitance parameters for controlling an oscillator, etc.

Figure 2:
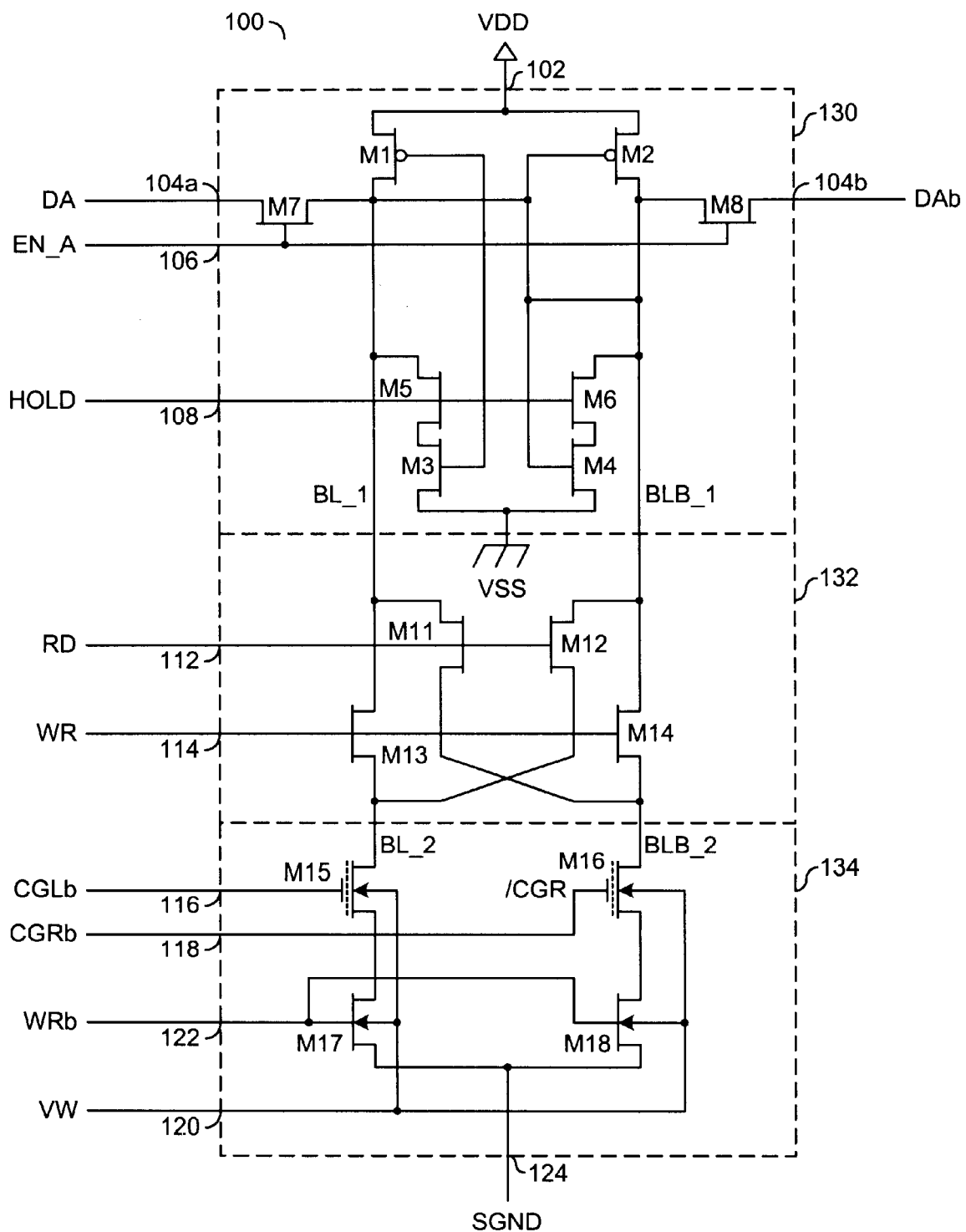
FIG. 2 is a schematic diagram of the circuit of FIG. 1.

Referring to FIG. 2, a schematic diagram of the circuit 100 is shown. In one example, the circuit 130 may comprise a transistor M1, a transistor M2, a transistor M3, a transistor M4, a transistor M5, a transistor M6, a transistor M7, and a transistor M8. A gate of the transistor M1, a gate of the transistor M3, and a drain of each of the transistors M2 and M6 may be coupled to form the bitline bar BLB_1. A gate of the transistors M2 and M4 may be coupled with a drain of each of the transistors M1 and M5 to form the bitline BL_1. The circuit 130 may be configured as a volatile latch circuit. The transistors M7 and M8 may form a data port. A first source/drain of the transistors M7 and M8 may receive/present the signals DA and DAB, respectively. A second source/drain of the transistors M7 and M8 may be coupled to the bitline BL_1 and the bitline bar BLB_1, respectively. A gate of the transistors M7 and M8 may be configured to receive the signal EN_A.

The circuit 132 may comprise, in one example, a transistor M11, a transistor M12, a transistor M13, and a transistor M14. The transistors M11, M12, M13, and M14 may be implemented, in one example, as one or more NMOS transistors. However, other types and polarity transistors may be implemented accordingly to meet the design criteria of a particular application. The transistors M11, M12, M13, and M14 may be configured as a differential multiplexer circuit. A first source/drain of the transistors M11 and M13 may be connected to the bitline BL_1. A first source/drain of the transistors M12 and M14 may be connected to the bitline bar BLB_1. A second source/drain of the transistors M11 and M14 may be connected to form the second bitline bar BLB_2. A second source/drain of the transistors M12 and M13 may be connected to form the second bitline BL_2. A gate of the transistors M11 and M12 may receive the signal RD. A gate of the transistors M13 and M14 may receive the signal WR.

In one example, the circuit 134 may comprise a transistor M15, a transistor M16, a transistor M17, and a transistor M18. The transistors M15 and M16 may be implemented using SONOS transistor technology. The transistors M15, M16, M17, and M18 may be configured as a non-volatile storage circuit. The transistors M15 and M17 may be coupled in series between the bitline BL_2 and the signal SGND. The transistors M16 and M18 may be coupled in series between the bitline bar BLB_2 and the signal SGND. The transistor M15 may have a control gate that may receive the signal CGLB and a well that may receive the signal VW. The transistor M16 may have a control gate that may receive the signal CGRB and a well that may receive the signal VW. The transistors M17 and M18 may each have a gate that may receive the signal WRB and a well that may receive the signal VW.

Data may be loaded from the circuit 134 into the circuit 130 via the bitlines BL_1 and BL_2 and the bitline bars BLB_1 and BLB_2 in response to the signals LOAD, HOLD, RD, WR, CGLB, CGRB, WRB, SGND, and VW. Data may be loaded from the circuit 130 into the circuit 134 via the bitlines BL_1 and BL_2 and the bitline bars BLB_1 and BLB_2 in response to the signals LOAD, HOLD, RD, WR, CGLB, CGRB, WRB, SGND, and VW.

Figure 3:
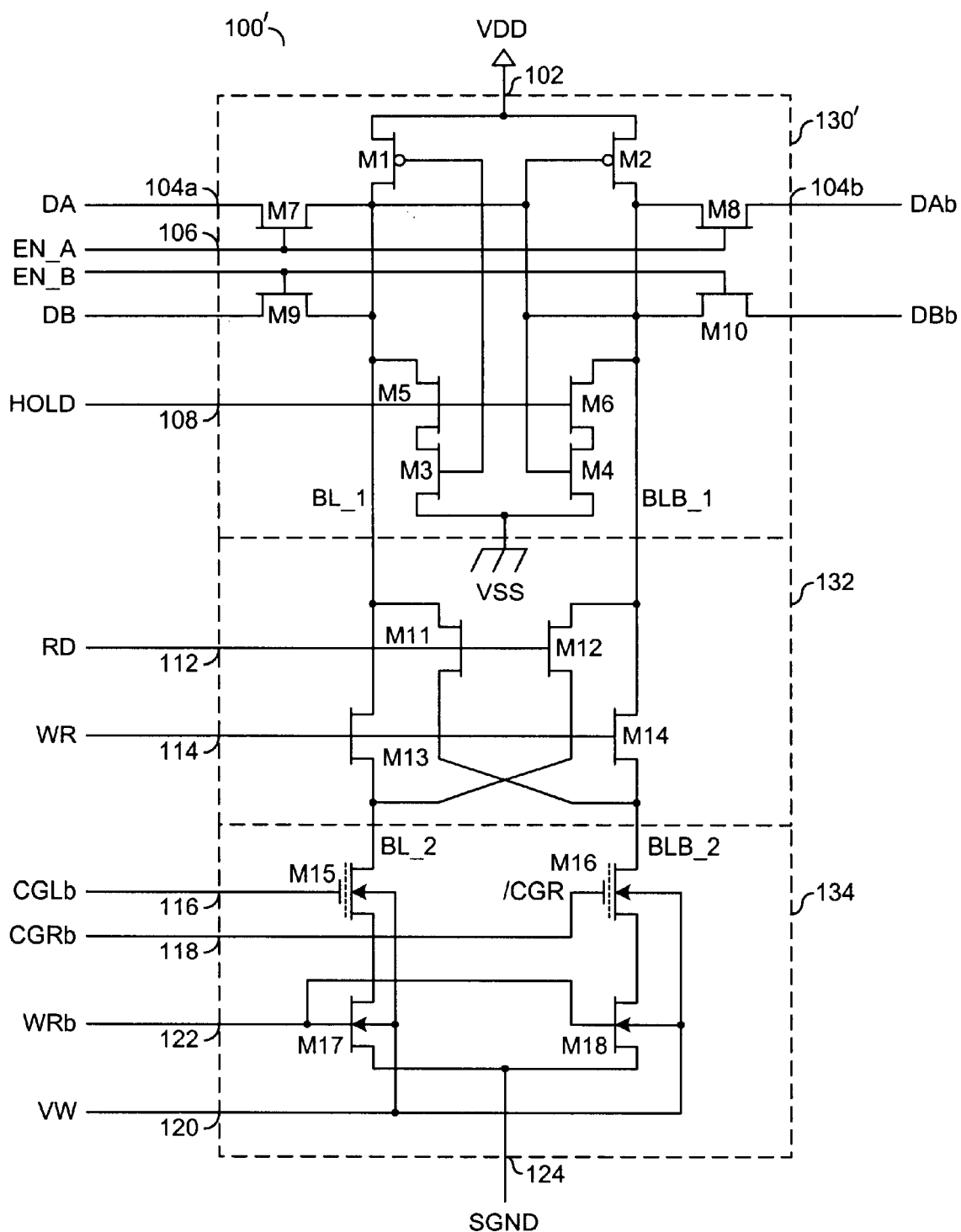
FIG. 3 is a schematic diagram of an alternative embodiment of the circuit of FIG. 1.

Referring to FIG. 3, a schematic diagram of a circuit 100' illustrating an alternative embodiment of the circuit 100 is shown. The circuit 100' may be implemented similarly to the circuit 100. The circuit 100' may comprise, in one example, a circuit 130'. The circuit 130' may be implemented as a dual-port volatile latch circuit. The circuit 130' may have an input/output pair that may receive/present a signal pair (e.g., DB and DBB, respectively) and input that may receive a signal (e.g., EN_B). The signals DB and DBB may be data input/output signals that may be received/presented to the circuit 100' via one or more data busses (not shown). The signal DBB may be digital complement of the signal DB. The signal EN_B may be a control signal that may control the writing and reading of the signals DB/DBB to and from the circuit 100'.

The circuit 130' may be implemented similarly to the circuit 130 except that the circuit 130' may comprise a transistor M9 and a transistor M10. The transistors M9 and M10 may form a second data port. A first source/drain of the transistors M9 and M10 may receive/present the signals DB and DBB, respectively. A second source/drain of the transistors M9 and M10 may be coupled to the bitline BL_1 and the bitline bar BLB_1, respectively. A gate of the transistors M9 and M10 may be configured to receive the signal EN_B. In one example, the second data port may be primarily used for test operations.

Figure 4:
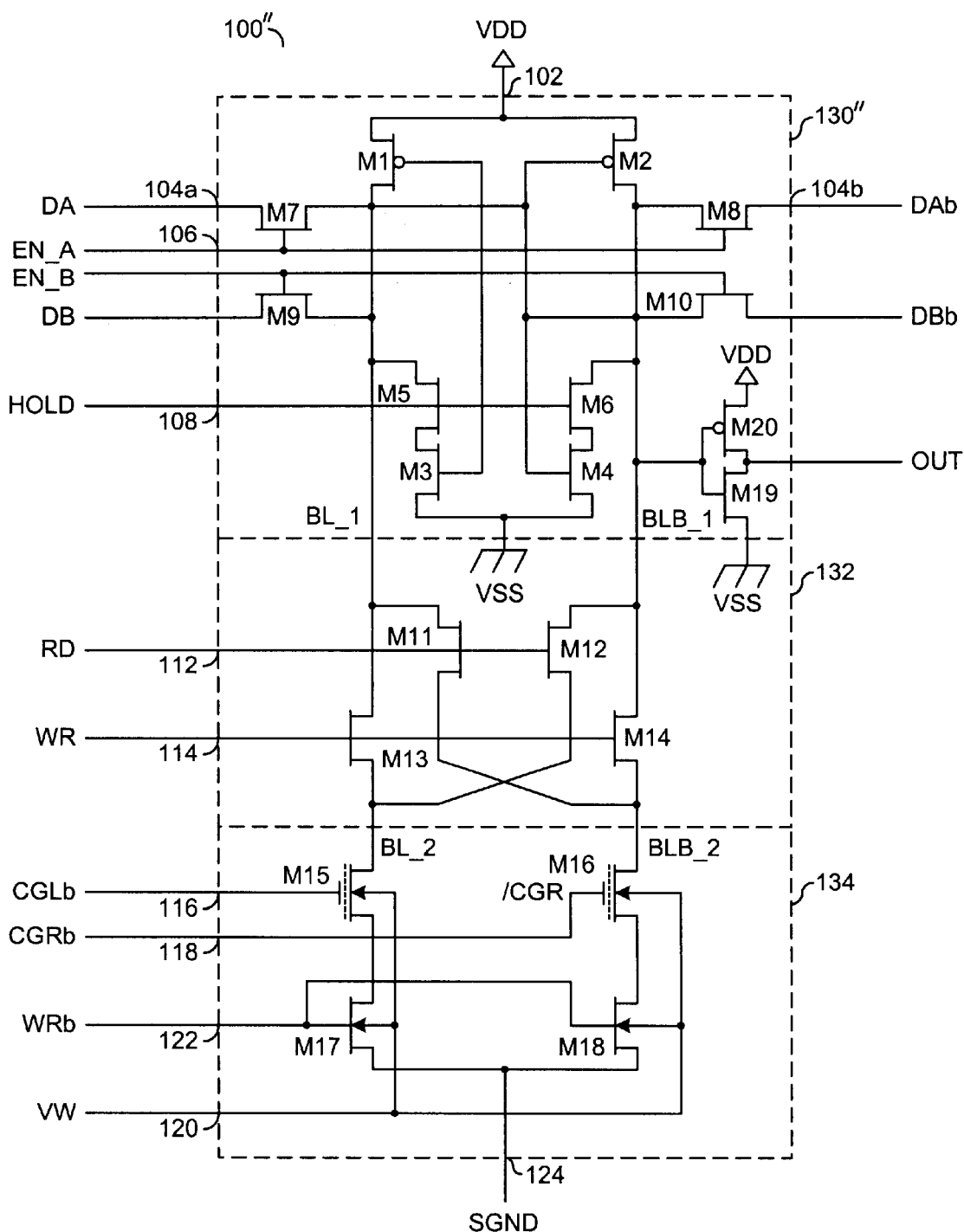
FIG. 4 is a schematic diagram of another alternative embodiment of the circuit of FIG. 1.

Referring to FIG. 4, a schematic diagram of a circuit 100" illustrating another alternative embodiment of the circuit 100 is shown. The circuit 100" may comprise, in one example, a circuit 130". The circuit 130" may be implemented as a dual-port volatile latch circuit including a static latch output circuit. The circuit 100" may have an output that may present a signal (e.g., OUT). The signal OUT may be a static latch output signal generated in response to the data stored in the circuit 130".

In one example, the circuit 130" may comprise a transistor M19 and a transistor M20. The transistors M19 and M20 may be configured as a static latch output port circuit. The transistors M19 and M20 may be configured as a CMOS inverter. The transistors M19 and M20 may present a complement of the data on the bitline BL_1 or the bitline bar BLB_1 as the signal OUT. The transistors M19 and M20 may be implemented, in another example, as part of the circuit 130.

In one example, the transistors M1, M2, and M20 may be implemented as PMOS transistors and the transistors M3–M19 may be implemented as NMOS transistors. However, other transistor types and/or polarities may be implemented accordingly to meet the design criteria of a particular application.

While the circuit 130 has been shown as a double-ended latch circuit, in an alternative embodiment, a single-ended latch circuit may be implemented. While the switching circuit 132 has been shown as a differential multiplexer, in another alternative embodiment, the circuit 132 may be implemented as a single-ended switching circuit. While the circuit 134 has been shown as a double-ended memory cell circuit, in an alternative embodiment, the circuit 134 may be implemented as a single-ended memory cell circuit.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a latch circuit configured to be dynamically programmable;
   a non-volatile storage circuit configured to be re-programmable; and
   a switching circuit configured to transfer data from (i) said non-volatile memory element into said latch circuit in response to a first control signal and (ii) said latch circuit into said non-volatile memory circuit in response to a second control signal.

2. The apparatus according to claim 1, wherein said data is transferred from said non-volatile memory circuit into said latch circuit on system startup.

3. The apparatus according to claim 1, wherein said non-volatile memory circuit is erasable.

4. The apparatus according to claim 1, wherein said apparatus comprises a non-volatile static random access memory (SRAM).

5. The apparatus according to claim 1, wherein said non-volatile storage circuit comprises one or more silicon, oxide, nitride, oxide, silicon (SONOS) transistors.

6. The apparatus according to claim 1, wherein said latch circuit comprises a single-port latch circuit.

7. The apparatus according to claim 1, wherein said latch circuit comprises a multi-port latch circuit.

8. The apparatus according to claim 1, wherein said switching circuit comprises a single-ended switching circuit.

9. The apparatus according to claim 1, wherein said switching circuit comprises a differential multiplexer circuit.

10. The circuit according to claim 1, wherein the number of times said non-volatile storage circuit is re-programmable is unlimited.

11. The circuit according to claim 1, wherein said latch circuit is dynamically programmable via one or more data busses in response to a third control signal.

12. An apparatus for storing and retrieving data comprising:
   means for reading data from or writing data to a bus using a latch circuit in response to a first control signal;
   means for reading data from or writing data to said latch circuit using a non-volatile storage circuit in response to a second control signal; and
   means for selecting operating modes of said latch circuit and said non-volatile storage circuit using a switching circuit.

13. A method of storing and retrieving data comprising the steps of:

(A) reading data from or writing data to a bus using a latch circuit in response to a first control signal;

(B) reading data from or writing data to said latch circuit using a non-volatile storage circuit in response to a second control signal; and (C) selecting operating modes of said latch circuit and said non-volatile storage circuit using a switching circuit.

14. The method according to claim 13, further comprising the step of writing said data to said latch circuit from said non-volatile storage circuit on system startup.

15. The method according to claim 13, further comprising the step of erasing said non-volatile storage circuit.

16. The method according to claim 15, further comprising the step of re-programming said non-volatile storage circuit.

17. The method according to claim 16, wherein the number of times said re-programming step is performed is unlimited.

18. The method according to claim 15, further comprising the step of re-programming a silicon, oxide, nitride, oxide, silicon (SONOS),non-volatile storage circuit.

19. The method according to claim 13, wherein said bus comprises one or more data busses.

20. The method according to claim 13, further comprising the step of:
   storing system configuration data in said non-volatile storage circuit, wherein said system configuration data comprises information for frequency tables, look-up tables, selection of chip pins, familiarization of A/D converters, function enabling, spread spectrum values, capacitance values, and/or voltage to capacitance parameters.

* * * * *